United States Patent
Kummerl et al.

(10) Patent No.: US 11,551,986 B2
(45) Date of Patent: Jan. 10, 2023

(54) SHAPE MEMORY POLYMER FOR USE IN SEMICONDUCTOR DEVICE FABRICATION

(71) Applicant: Texas Instruments Incorporated, Dallas, TX (US)

(72) Inventors: Steven Alfred Kummerl, Carrollton, TX (US); Benjamin Stassen Cook, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/220,782

(22) Filed: Apr. 1, 2021

(65) Prior Publication Data
US 2021/0313241 A1 Oct. 7, 2021

Related U.S. Application Data (60) Provisional application No. 63/004,281, filed on Apr. 2, 2020.

(51) Int. Cl.
| | | |
|---|---|---|
| *H01L 23/14* | (2006.01) | |
| *H01L 21/48* | (2006.01) | |
| *H01L 23/498* | (2006.01) | |
| *H01L 21/78* | (2006.01) | |

(52) U.S. Cl.
CPC ........ *H01L 23/145* (2013.01); *H01L 21/4853* (2013.01); *H01L 21/78* (2013.01); *H01L 23/4985* (2013.01); *H01L 23/49838* (2013.01)

(58) Field of Classification Search
CPC ... H01L 23/145; H01L 21/4853; H01L 21/78; H01L 23/49838; H01L 23/4985; H01L 21/4846; H01L 23/13; H01L 23/5387
USPC .......................................................... 257/668
See application file for complete search history.

(56) References Cited

U.S. PATENT DOCUMENTS

| | | | | |
|---|---|---|---|---|
| 7,727,450 B1 * | 6/2010 | Berger | ................... | B29C 33/40 264/266 |
| 9,954,139 B2 * | 4/2018 | Krause | ............. | H01L 21/76251 |
| 2008/0242052 A1 * | 10/2008 | Feng | ................... | H01L 21/3043 438/459 |
| 2015/0342050 A1 * | 11/2015 | Jiang | ...................... | H05K 1/148 361/749 |
| 2018/0144982 A1 * | 5/2018 | Muri | ....................... | H01L 21/78 |

* cited by examiner

*Primary Examiner* — Vu A Vu
(74) *Attorney, Agent, or Firm* — Frank D. Cimino (57) ABSTRACT

A method for forming a semiconductor structure includes curing a shape memory polymer in a first shape. The shape memory polymer is coupled to a conductive layer. The method further includes folding the shape memory polymer from the first shape into a second shape. The method also includes bonding a semiconductor wafer to the conductive layer while the shape memory polymer is in the second shape. The semiconductor wafer has first and second dies. The semiconductor wafer is then singulated to separate the first die from the second die. The method further includes expanding the shape memory polymer to its first shape and singulating the shape memory polymer to separate the first and second dies.

18 Claims, 11 Drawing Sheets

SHAPE MEMORY POLYMER FOR USE IN SEMICONDUCTOR DEVICE FABRICATION

CROSS-REFERENCE TO RELATED APPLICATION

This application claims priority to U.S. Provisional Application No. 63/004,281, filed Apr. 2, 2020, which is hereby incorporated by reference.

BACKGROUND

A semiconductor the typically includes an integrated circuit formed thereon. The die then may be attached to a substrate and packaged with mold compound to form a completed semiconductor device ("chip"). Multiple (e.g., tens, hundreds, thousands) of dies are formed on a semiconductor wafer. Typically, the individual dies are singulated from the wafer and, through a pick-and-place process, each individual die is picked and placed on a corresponding substrate. The pick-and-place process is time-consuming.

SUMMARY

A method for forming a semiconductor structure includes curing a shape memory polymer in a first shape. The shape memory polymer is coupled to a conductive layer. The method further includes folding the shape memory polymer from the first shape into a second shape. The method also includes bonding a semiconductor wafer to the conductive layer while the shape memory polymer is in the second shape. The semiconductor wafer has first and second dies. The semiconductor wafer is then singulated to separate the first die from the second die. The method further includes expanding the shape memory polymer to its first shape and singulating the shape memory polymer to separate the first and second dies.

DETAILED DESCRIPTION

The examples described herein are directed to the use of a shape memory polymer that is part of a substrate to be bonded to a semiconductor wafer having multiple semiconductor dies. The wafer is bonded to the substrate before the wafer is singulated into its individual dies. The shape memory polymer causes the substrate to have a first shape (e.g., flat) during a curing process. The substrate is then folded into a second shape such that the dies on the wafer can be bonded to corresponding die receiving portions of the substrate. The substrate's die receiving portions are closer together when the substrate is in its folded, second shape than when the substrate is in its first shape. After the wafer is bonded to the folded substrate, the wafer is singulated and the substrate is then heated to cause the substrate, and the singulated dies bonded thereto, to unfold back into its first shape. The substrate can then be singulated to separate out the individual dies and corresponding portions of the substrate. Wafer-level bonding the substrate to the wafer and then separating the individual dies is faster than a pick-and-place process in which the wafer is first singulated and then individual dies are picked and placed on a substrate. Further, the distance between receiving portions on the substrate is not required to match the distance between the dies on the wafer when the substrate is in its first (flat) shape. The folding of the substrate effectively reduces the distance between the die receiving portions on the substrate so as to match the die pattern on the wafer.

Figure 1:
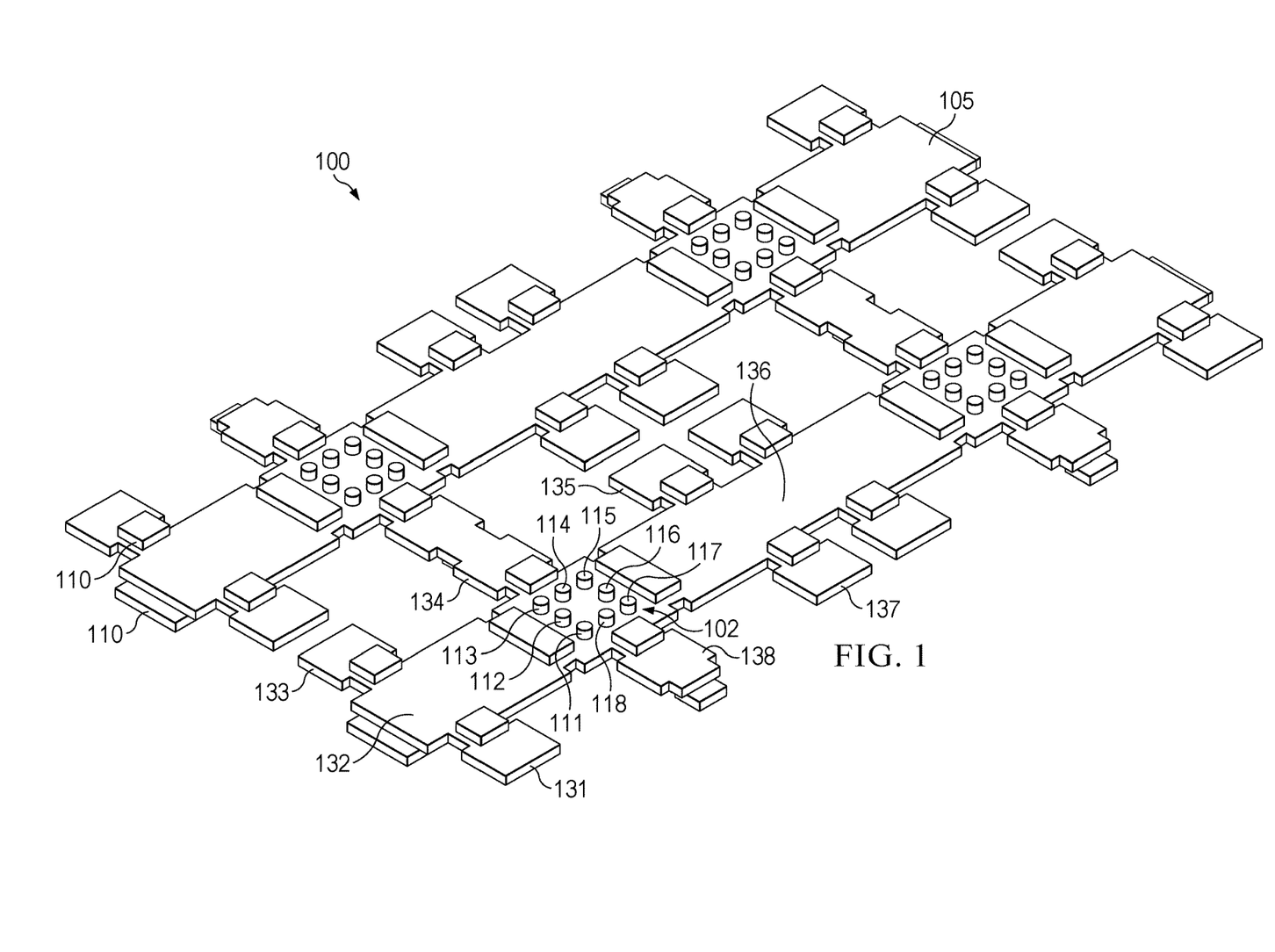
FIGS. 1 and 2 illustrate an example of a substrate having a shape memory polymer and configured into a first shape.
Figure 2:
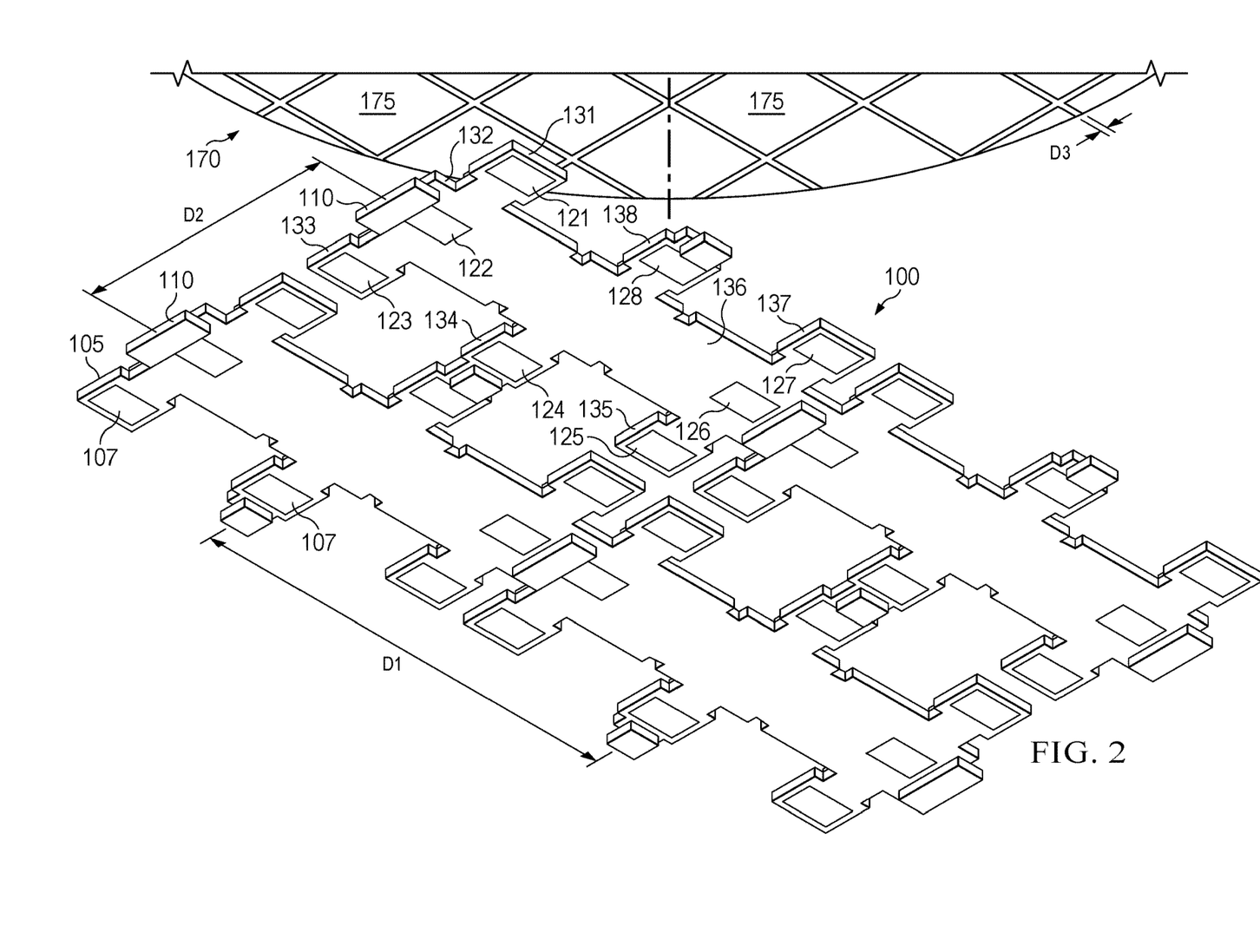

FIGS. 1 and 2 show an example of at least a portion of a substrate 100 that includes a shape memory polymer 110. FIGS. 1 and 2 are views of the substrate 100 from opposite sides. The substrate 100 includes multiple materials such as a layer of polyimide 105, a conductive layer (e.g., copper) 107 (shown in FIG. 2), and one or more layers of a shape memory polymer 110. Examples of polyimide 105 include thermosetting and thermoplastic. The shape memory polymer 110 is a polymeric material that has the ability to acquire a permanent shape upon mechanically forcing the material into the desired permanent shape and then curing the material while in that shape. In one example, the curing process may include the application of an ionizing radiation, such as ionizing radiation that is useful in food and medical product sterilization. Depending on the polymer, the amount (dose) can be varied to impart the desired level of crystallization. The material will then retain that shape. The shape memory polymer material can then be deformed and then returned from the deformed state (temporary shape) to its original (permanent) shape upon application of an external stimulus, such as temperature change, application of an electric field, or application of a magnetic field. Examples of shape memory polymer 110 include a thermoplastic or thermoset material such at least one of PET (polyethylene terephthalate), polyurethanes, polyimides, polybenzoxazoles (PBO), polytetrafluoroethylene (PFTE), polylactide (PLA), or ethylene-vinyl acetate (EVA).

The substrate 100 includes multiple die receiving portions 102. Each die receiving portion 102 includes one or more conductive contacts to which corresponding pins of a semiconductor die can be attached (e.g., soldered). In the example of FIGS. 1 and 2, that portion of the substrate 100 shown includes four die receiving portions 102, each of which is adapted to receive a separate die as explained below. FIG. 1 illustrates each of the die receiving portions includes eight conductive contacts, labeled in one of the die receiving portions as contacts 111-118. A die to be attached to that die receiving portion includes eight corresponding pins. In this example, each die receiving portion 102 includes the same number of contacts, the same pattern of contacts, and the same spacing (pitch) between adjacent contacts. As explained below, the substrate 100 is attached to a wafer containing multiple dies. In one example, the wafer may have dozens, hundreds, thousands, or tens of thousands of dies, and the substrate 100 has the corresponding number of die receiving portions 102.

The contacts 111-118 of each die receiving portion 102 on the substrate 100 fan out to pads 121-128 (FIG. 2) through the conductive layer 107. Contact 111 is coupled to pad 121. Contact 112 is coupled to pad 122. Contact 113 is coupled to pad 123. Contact 114 is coupled to pad 124. Contact 115 is coupled to pad 125. Contact 116 is coupled to pad 126. Contact 117 is coupled to pad 127. Contact 118 is coupled to pad 128. By attaching (e.g., soldering) pads 121-128 to a printed circuit board (PCB), electrical connection is thereby established between the PCB and the die's pins.

Each die receiving portion 102 in this example includes a central area to which a die is coupled and peripheral portions containing the contact pads 121-128. FIG. 2 shows that contact pad 121 is on peripheral portion 131. Similarly, contact pad 122 is on peripheral portion 132. Contact pad 123 is on peripheral portion 133. Contact pad 124 is on peripheral portion 134. Contact pad 125 is on peripheral portion 135. Contact pad 126 is on peripheral portion 136. Contact pad 127 is on peripheral portion 137. Contact pad 128 is on peripheral portion 138.

In one embodiment, the shape memory polymer 110 includes a shape memory polymer layer on opposites surfaces of the combination of the polyimide 105 and conductive layer 107, and some areas of the shape memory polymer 110 may be removed to expose contact pads 121-128 of the conductive layer 107 which may eventually be soldered to, for example, a PCB. For ease of viewability, only some of the shape memory polymer 110 is shown in FIGS. 1 and 2. The portions shown of the shape memory polymer 110 represent fold lines, described below, along which the substrate 100 will be folded before the substrate 100 is attached to the wafer.

FIG. 2 illustrates a wafer 170 including multiple dies 175 before the wafer 170 is attached to the substrate 100. The distance between the adjacent receiving portions 102 in one axis is D1, and the distance between adjacent receiving portions 102 in the orthogonal axis is D2. The spacing between adjacent dies 175 on wafer 170, however, is D3, and D3 is substantially smaller than either D1 or D2. Accordingly, the wafer 170 is fabricated with the dies 175 being in closer proximity to one another than is the spacing between the die receiving portions 102 on the substrate 100 when the substrate is a flat shape as shown in FIGS. 1 and 2.

As explained above, the substrate 100 includes a shape memory polymer 110. The substrate 100 is put into a flat shape as shown in FIGS. 1 and 2 and cured while in that shape. The curing process may be as explained above. As a result of the curing process, the shape memory polymer 110 retains this flat shape as its permanent shape.

The substrate 100 is then folded along the fold lines delineated by the locations of the shape memory polymer 110 in FIGS. 1 and 2. The following explanation of the folding of the substrate 100 is with respect to the peripheral portions 131-138 of the receiving portion 102 as numbered in FIGS. 1 and 2, but the other receiving portions on the substrate 100 are configured the same and thus the folds are the same with respect to all such receiving portions.

All angles referenced herein are approximate angles even if the adjective "approximately" is not specifically used. For example, a reference to a 90-degree angle means approximately 90 degrees. In one example, "approximately" means plus or minus 10%. Accordingly, an angle of approximately 90 degrees means 90 degrees+/− 10% (90 degrees+/− 0.9 degrees). The term "flat" means a structure that has a planar surface or a surface that is not bowed or bent more than 10%.

Figure 3:
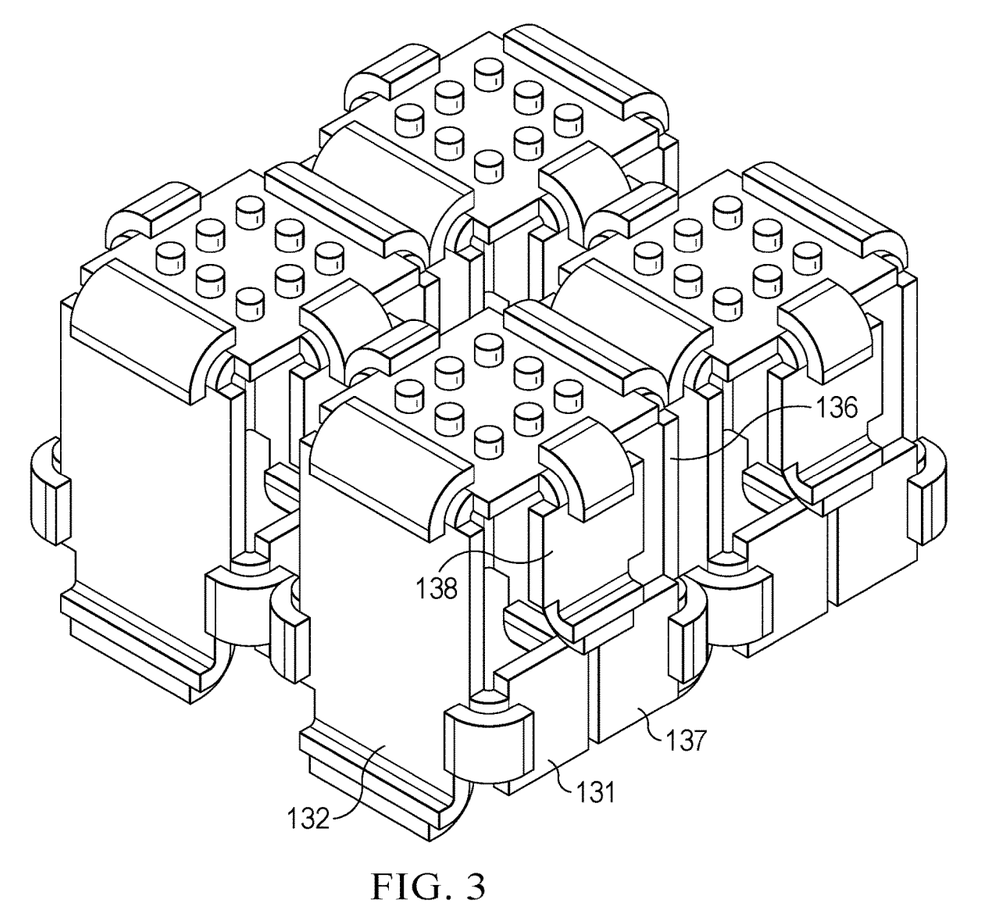
FIGS. 3-6 illustrate the substrate folded into a second shape for bonding to a semiconductor wafer in accordance with an example.
Figure 4:
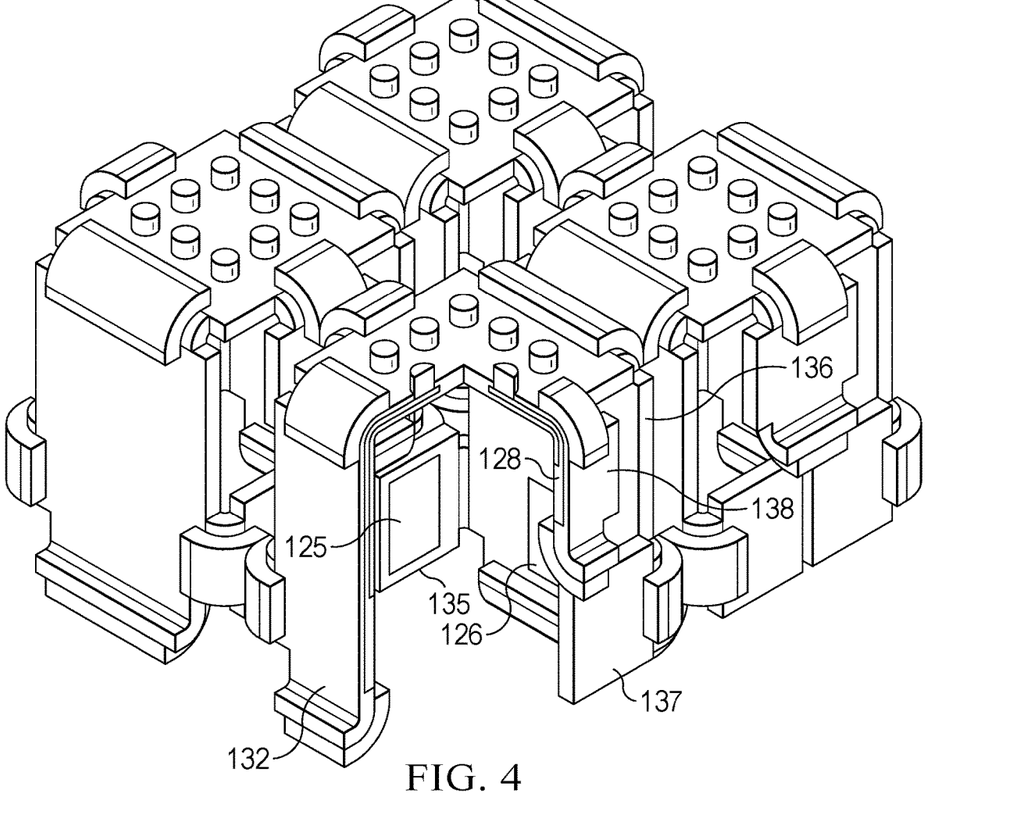
Figure 5:
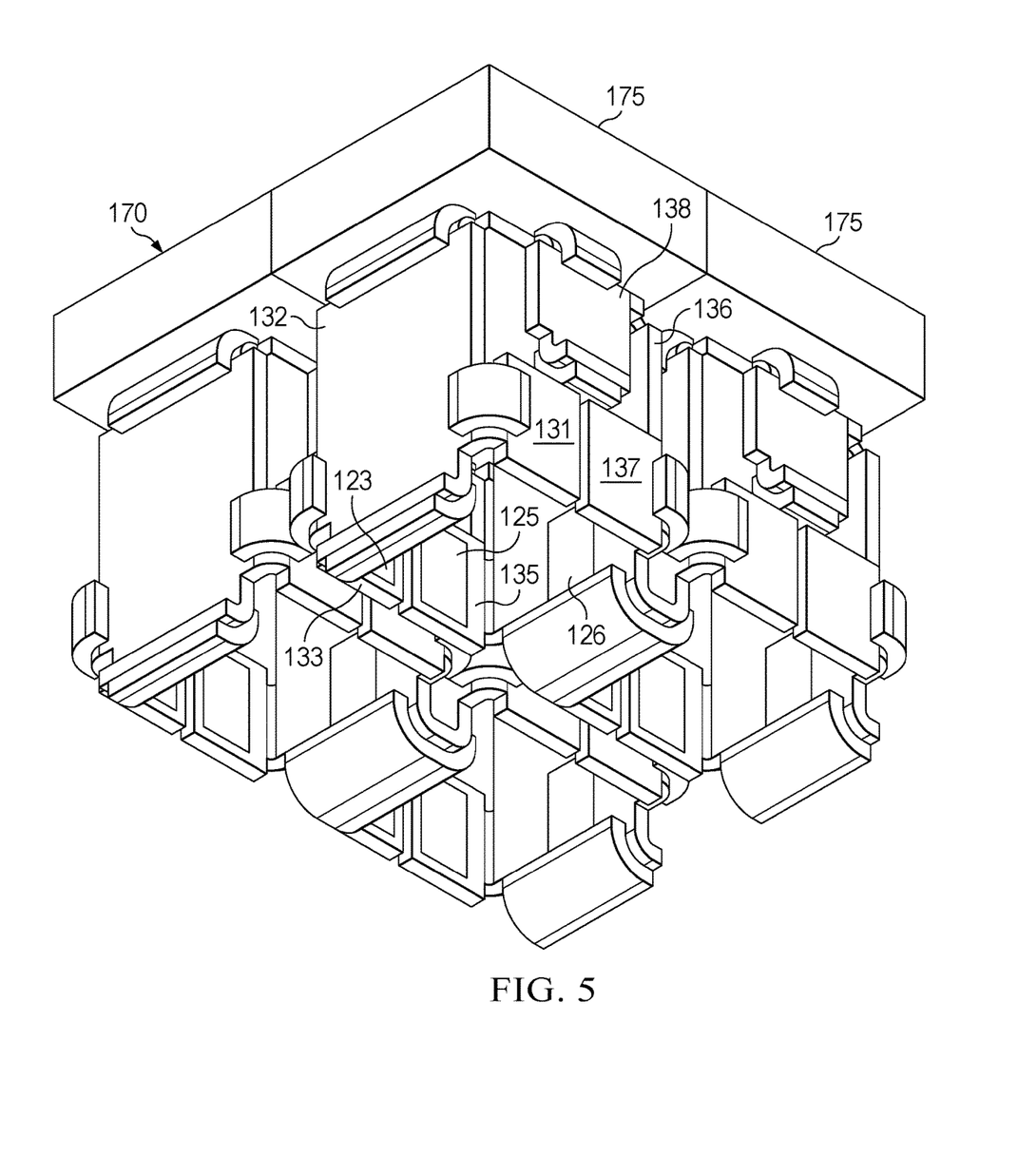
Figure 6:
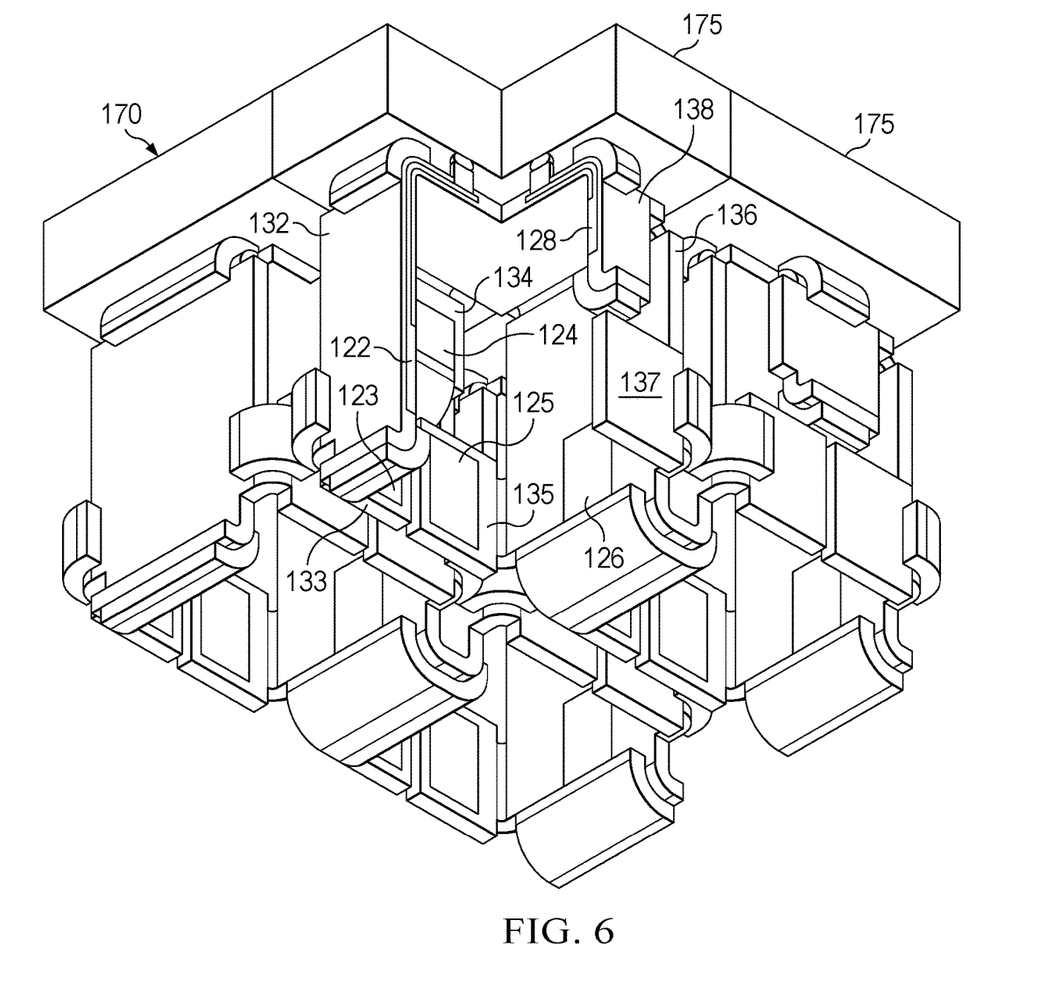

FIGS. 3-6 illustrate an example of the substrate 100 in a folded shape. An example technique for folding the substrate is described below. FIG. 3 shows a top perspective view of the substrate. FIG. 4 shows the same view but with a front corner removed to better show components that are otherwise hidden. FIGS. 5 and 6 show views of the folded structure but from the bottom. FIGS. 5 and 6 also show semiconductor wafer 170 with dies 175 attached to their respective die receiving portions 102 of the substrate 100. The parenthetical figure references below are the figures that may best show a certain component.

Referring collectively to FIGS. 3-6, peripheral portions 132, 134 (FIG. 6), 136, and 138 are shown folded downward from the plane defining the receiving portion 102 which will receive the die. The peripheral portions 132, 134, 136, and 138 are angled downward 90 degrees. Further, the peripheral portions 131, 133 (FIGS. 5 and 6), 135 (FIGS. 4-6), and 137 are folded inward by 90 degrees relative to the planes of their respective peripheral portions 132, 134, 136, and 138 as shown.

With the substrate folded along the fold lines as shown in FIGS. 3-6, adjacent die receiving portions 102 of the substrate are drawn closer together resulting in the distance between the adjacent die receiving portions matching the distance between the respective dies 175 on the wafer 170—that is, matching closely enough to accommodate the wafer 170 to be bonded to the substrate 100 and the dies 175 to bond to their respective die receiving portions.

Figure 7:
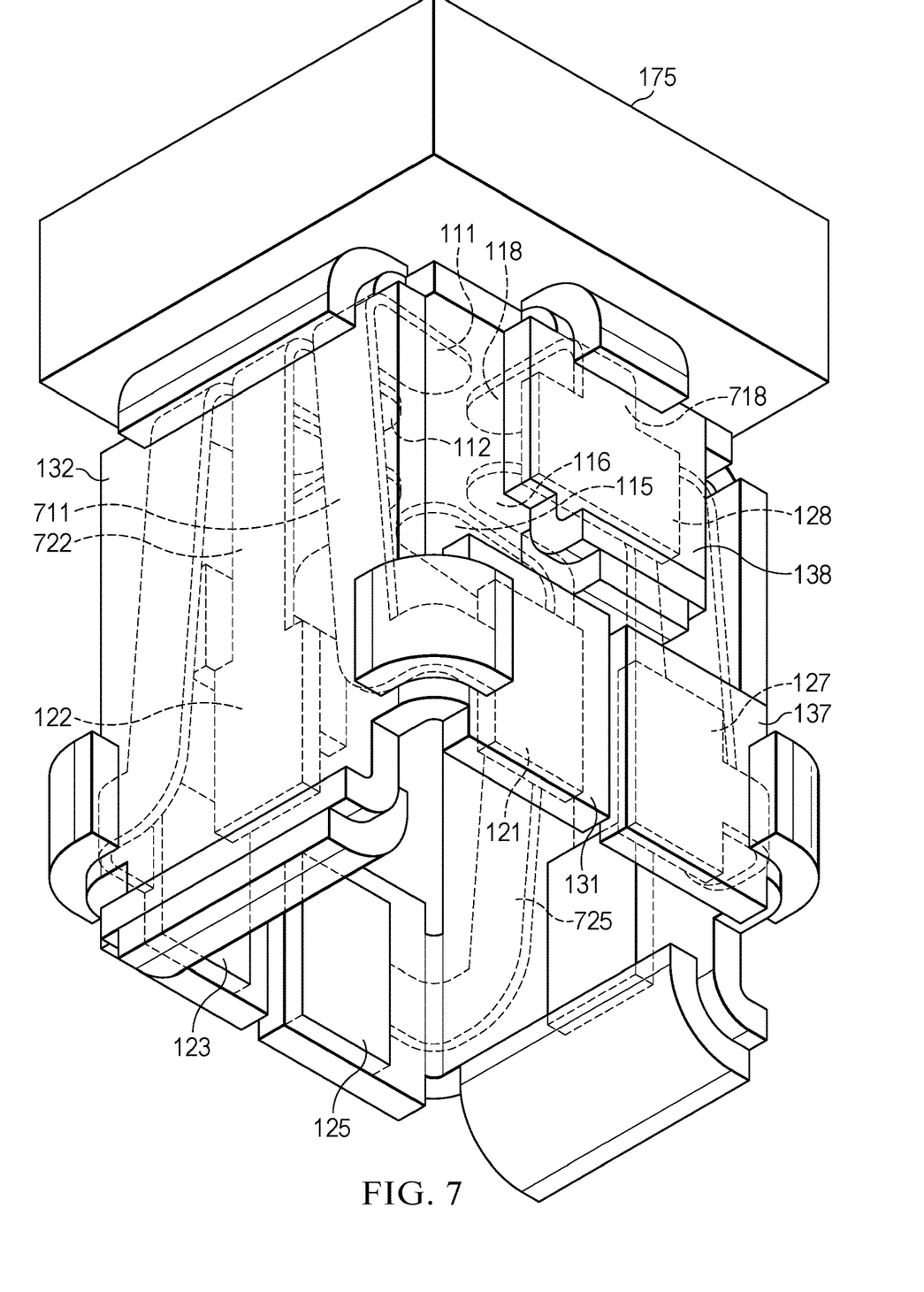
FIG. 7 illustrates an individual die receiving portion of the substrate folded into the second shape.

FIG. 7 illustrates an individual die receiving portion 102 of the substrate folded into the second shape with a die 175 attached thereto. The dashed lines in FIG. 7 are some of the pads that are part of the conductive layer 107, which are hidden from view by their respective peripheral portions which have been folded as described above. Also illustrated in FIG. 7 are some of the conductive connective portions of the conductive layer 107 that couple the pads to their respective contacts, to which the pins of the die 175 are coupled. For example, pad 122 is coupled to contact 112 by connective portion 722. Pad 121 is coupled to contact 111 by connective portion 711. Pad 125 is coupled to contact 115 by connective portion 725. Pad 128 is coupled to contact 118 by connective portion 718. The conductive layer 107 and thus the connective portions of the conductive layer are flexible enough to be bent as shown without breaking. In flex circuit designs, copper has been demonstrated to survive multiple flexures without cracking. For thicker copper structures a cold rolled copper may be used for prolonged flexure endurance.

Figure 8:
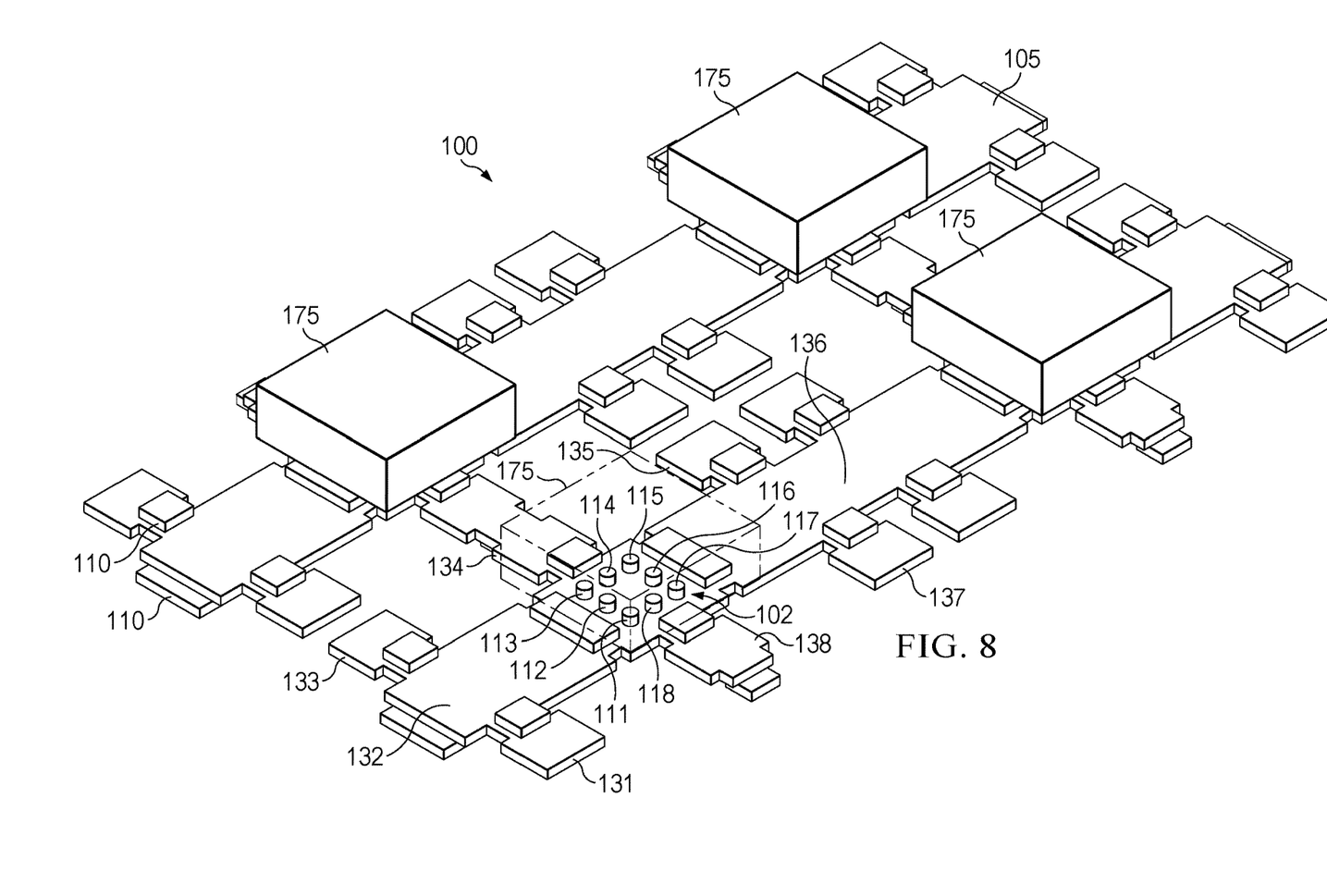
FIG. 8 illustrates an example of the substrate having the shape memory polymer unfolded back into the first shape with individual semiconductor dies attached thereto.

After wafer bonding the folded substrate 100 to the wafer 170, the wafer 170 is singulated to separate the individual dies from each other. The substrate 100 is then expanded back to its permanent shape through application of, for example, heat above the glass transition temperature threshold of the shape memory polymer 110. FIG. 8 shows an example of the substrate 100 back in its initial permanent shape with individual dies 175 attached to their respective die receiving portions 102.

Figure 9:
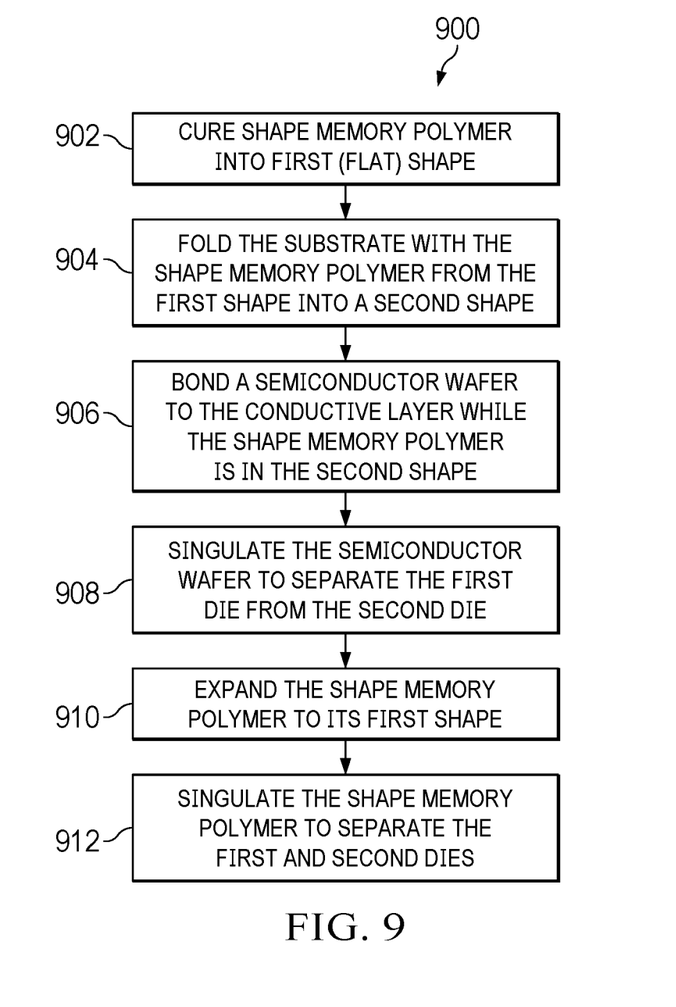
FIG. 9 is an example method for fabricating the device described herein.

FIG. 9 is an example of a process 900 to attach the wafer 170 to the substrate and singulate the resulting structure into individual devices. FIGS. 10-14 illustrate various stages of the structure during the process flow depicted in FIG. 9. Step 902 in process 900 includes curing a shape memory polymer into a first (e.g., flat) shape, such as that shown in FIGS. 1 and 2. This step may be performed by, for example, mechanically forcing the substrate containing the shape memory polymer into a flat shape and then applying an ionizing radiation such as is used for food and medical device sterilization. The time and/or dose can be varied to impart the desired level of cross-linking which also affects the modulus of the material.

Figure 10:
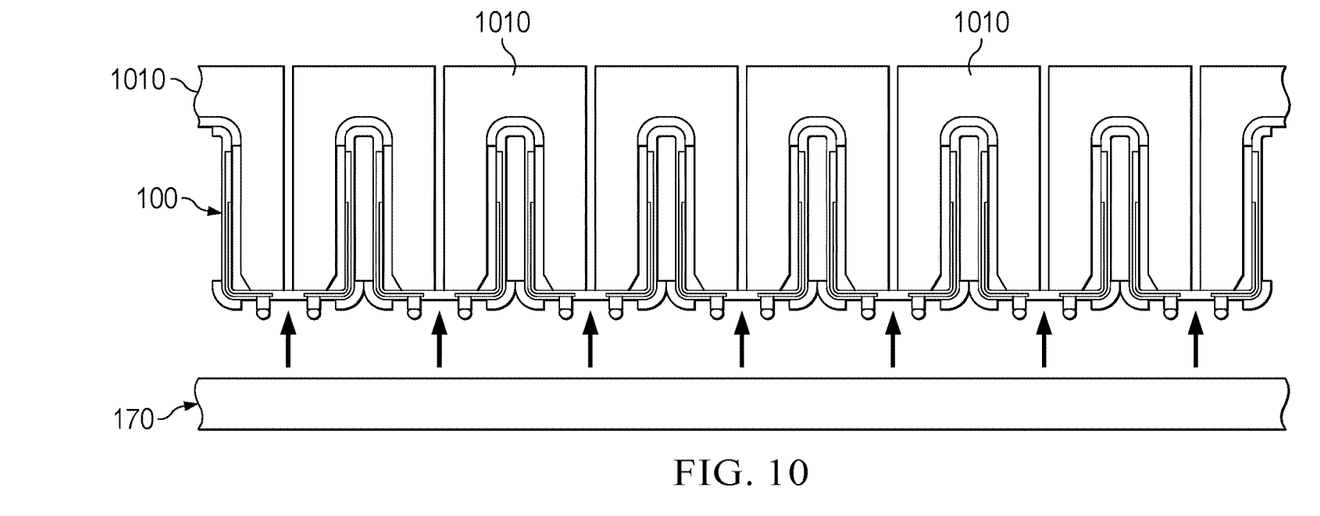
FIGS. 10-14 show the substrate and wafer at various stages of the fabrication process.

At step 904 and illustrated in the example of FIG. 10, the substrate with the shape memory polymer is then folded into a second shape. FIGS. 3-7 provide examples of a folded substrate. FIG. 10 illustrates an example of performing step 904 in which a heated vacuum mandrel 1010 is used. The vacuum mandrel has a shape that is the inverse shape of the desired folded substrate. The vacuum pressure restrains the substrate in the folded state within the mandrel. This tooling constrains the substrate when the wafer bonding temperature is above the glass transition (Tg) temperature of the Shape Memory Polymer) FIG. 10 also shows the wafer 170 before it is bonded to the substrate 100.

Figure 11:
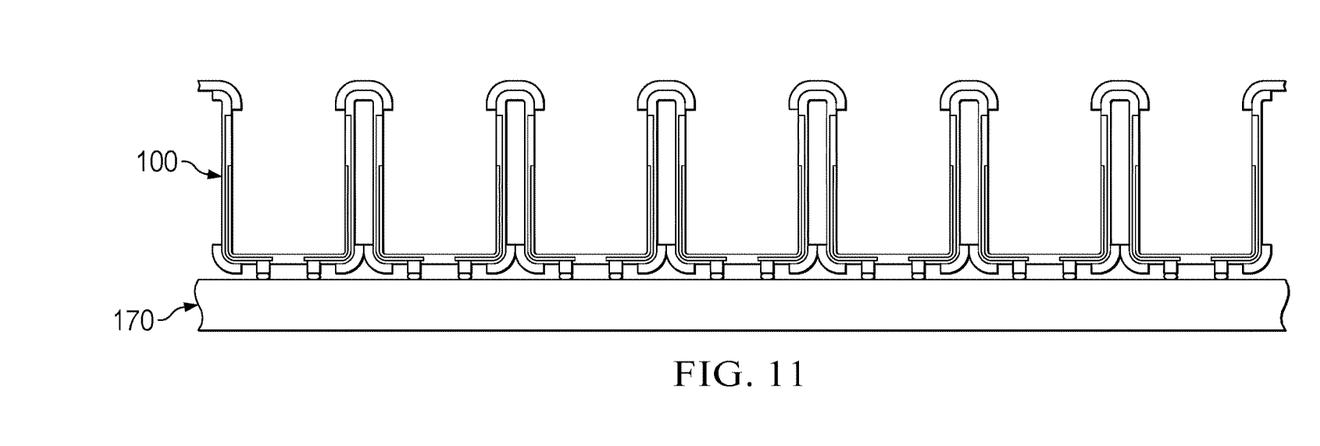
Figure 12:
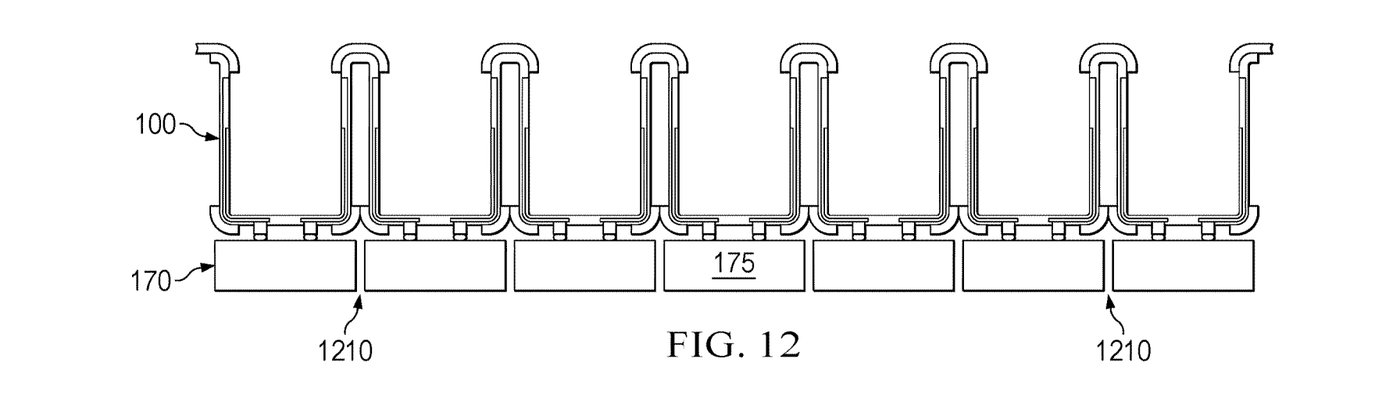

At step 906, the semiconductor wafer 170 is bonded to the conductive layer 107 of the folded substrate 100 within the vacuum mandrel. The vacuum mandrel 1010 can then be removed as illustrated in FIG. 11. At step 908, the wafer 170 is singulated as is indicated by cut lines 1210 in FIG. 12. The cut lines 1210 are between adjacent dies on the wafer. In one example, a laser is used to cut the wafer 170.

Figure 13:
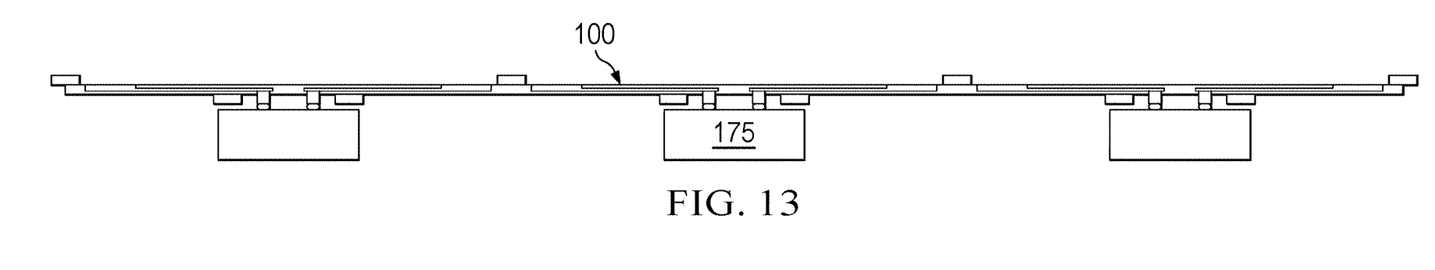

At step 910, the method includes expanding (e.g., unfolding) the substrate with the shape memory polymer back into its first state (flat). This step may be performed as explained above (e.g., application of heat in excess of the glass transition temperature of the shape memory polymer). FIG. 13 illustrates the substrate 100 in its flat state. As a result of expanding the substrate, the dies 175 are spaced farther apart in FIG. 13 than was the case in FIG. 12.

Figure 14:
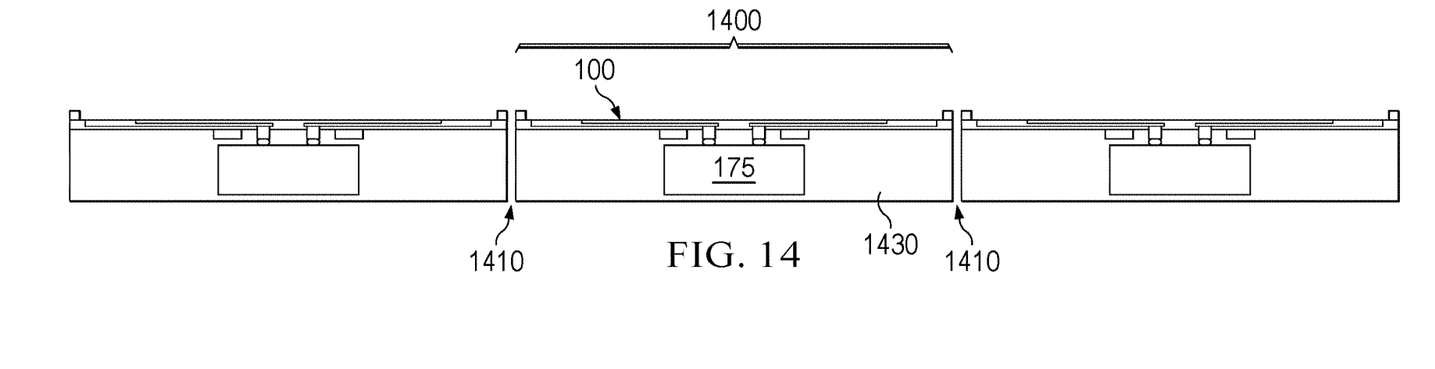

At step 912, the substrate is singulated along cut lines 1410 (FIG. 14) to separate the individual devices 1500 from each other. Each device 1550 includes a die 175 bonded to a portion of the substrate 100. Mold compound 1430 may then be applied to encapsulate the device 1400. In another example, mold compound can be applied across the wafer 170 after the substrate 100 is expanded (FIG. 12) but before the substrate is singulated (FIG. 14).

Instead of including a separate shape memory polymer layer, in an alternate embodiment, the shape memory polymer properties can be incorporated within the polyimide 105 and conductive layer 107. Some areas of the polyimide can be removed to expose contact pads 121-128 of the conductive layer 107 which may eventually be soldered to, for example, a PCB. Two examples of a thermoset polyimide, shape memory polymer are ODA-ODPA (4,4'-diaminodiphenyl (ODA)-oxydiphthalic anhydride (ODPA)) and ODA-BPDA (4,4'-diaminodiphenyl (ODA)-biphenyltetracarboxylic dianhydride (BPDA)). These materials have suitable shape memory properties. For example, these materials have shape recovery greater than 90% from a deformed state once allowed to heat through the glass transition (Tg) temperature.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Modifications are possible in the described embodiments, and other embodiments are possible, within the scope of the claims.

What is claimed is:

1. A method of forming a semiconductor structure, the method comprising:
    curing a shape memory polymer in a first shape, the shape memory polymer coupled to a conductive layer;
    folding the shape memory polymer from the first shape into a second shape;
    bonding a semiconductor wafer to the conductive layer while the shape memory polymer is in the second shape, the semiconductor wafer having first and second dies;
    singulating the semiconductor wafer to separate the first die from the second die;
    expanding the shape memory polymer to its first shape; and
    singulating the shape memory polymer to separate the first and second dies.

2. The method of claim 1, wherein expanding the shape memory polymer comprises heating the shape memory polymer.

3. The method of claim 1, wherein the shape memory polymer comprises a thermoplastic or a thermoset material.

4. The method of claim 1, wherein the first shape is flat, and the second shape has at least one 90-degree bend.

5. The method of claim 1, wherein folding the shape memory polymer from the first shape into a second shape comprises folding the shape memory polymer along first and second axes orthogonal to one another.

6. The method of claim 1, wherein folding the shape memory polymer from the first shape into a second shape comprises applying the shape memory polymer to a vacuum mandrel.

7. The method of claim 1, wherein the first die has a first solder bump and the second die has a second solder bump, and bonding the semiconductor wafer to the conductive layer comprises attaching the first and second solder bumps to corresponding connection pads of the conductive layer.

8. The method of claim 1, further comprising applying mold compound on the semiconductor wafer after bonding the semiconductor wafer to the conductive layer but before singulating the semiconductor wafer.

9. The method of claim 1, wherein curing the shape memory polymer comprises applying ionizing radiation to the shape memory polymer.

10. A method, comprising:
    curing a shape memory polymer in a flat shape, the shape memory polymer being part of a substrate;
    folding the substrate from the flat shape into a folded shape;
    bonding a semiconductor wafer to the substrate while the substrate is in the second shape, the semiconductor wafer having dies formed thereon;
    singulating the semiconductor wafer to separate the dies from each other;
    expanding the substrate back to its flat shape; and
    singulating the substrate to separate the dies bonded to respective portions of the substrate from each other.

11. The method of claim 10, wherein expanding the substrate comprises heating the shape memory polymer.

12. The method of claim 10, wherein the shape memory polymer comprises a thermoplastic or thermoset material.

13. The method of claim 10, wherein folding the substrate into the folded shape comprises folding the shape memory polymer along first and second axes orthogonal to one another.

14. The method of claim 10, wherein folding the substrate from the flat shape into the folded shape comprises applying the substrate to a vacuum mandrel.

15. The method of claim 10, wherein bonding the semiconductor wafer to the substrate comprises soldering pins of at least one die to respective contacts on a conductive layer of the substrate.

16. The method of claim 10, wherein bonding the semiconductor wafer to the substrate comprises soldering pins of the dies to respective contacts on a conductive layer of the substrate.

17. The method of claim 10, further comprising applying mold compound over the semiconductor wafer after expanding the substrate back to the flat shape and before singulating the substrate.

18. The method of claim 10, wherein curing the shape memory polymer comprises applying ionizing radiation.

\* \* \* \* \*